US006915475B1

United States Patent
Tung et al.

(10) Patent No.: US 6,915,475 B1
(45) Date of Patent: Jul. 5, 2005

(54) DATA INTEGRITY MANAGEMENT FOR DATA STORAGE SYSTEMS

(75) Inventors: Victor W. Tung, Shrewsbury; Stephen Lawrence Scaringella, Holliston, both of MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/342,955

(22) Filed: Jun. 29, 1999

(51) Int. Cl.[7] .............................................. G11C 29/00
(52) U.S. Cl. ...................................................... 714/763
(58) Field of Search ................................ 714/752, 758, 714/800, 763, 6

(56) References Cited

U.S. PATENT DOCUMENTS

| | | | | |
|---|---|---|---|---|
| 4,849,975 A | * | 7/1989 | Patel ........................... 714/761 |
| 5,148,432 A | | 9/1992 | Gordon et al. ............... 714/710 |
| 5,285,456 A | * | 2/1994 | Cheney et al. ............... 714/800 |
| 5,619,723 A | | 4/1997 | Jones et al. ..................... 710/3 |
| 5,724,368 A | | 3/1998 | Zook .......................... 714/758 |
| 5,751,936 A | | 5/1998 | Larson et al. .................. 714/7 |
| 5,778,009 A | | 7/1998 | Frederickson et al. ...... 714/784 |
| 5,844,918 A | | 12/1998 | Kato |
| 5,894,485 A | * | 4/1999 | Halligan et al. ............. 714/807 |
| 5,941,998 A | * | 8/1999 | Tillson ......................... 714/54 |
| 6,131,176 A | * | 10/2000 | Sefidvash .................... 714/758 |
| 6,269,464 B1 | * | 7/2001 | Boussina et al. ........... 714/752 |

FOREIGN PATENT DOCUMENTS

WO    WO 91/01524    2/1991

* cited by examiner

Primary Examiner—Albert Decady
Assistant Examiner—Shelly A. Chase
(74) Attorney, Agent, or Firm—Fish & Richardson P.C.

(57) ABSTRACT

A system and method for maintaining the integrity of data in a storage system. The method includes receiving a plurality of blocks of data having a predetermined multiple-block error detecting code; reading each block of the blocks of data; generating, for each block of data, an information-containing portion including an individual error detecting code for the block of data; and storing each block of data and each corresponding information-containing portion.

17 Claims, 5 Drawing Sheets

DATA INTEGRITY MANAGEMENT FOR DATA STORAGE SYSTEMS

BACKGROUND OF THE INVENTION

The invention relates to maintaining the integrity of data, and more particularly maintaining the integrity of data stored in a disk storage system.

In modern computer systems, data is continuously transferred between host processors and its peripheral storage, or terminals. Errors may be introduced during the reading, writing, or actual transmission of the data. Consequently, error control has become an integral part in the design of modern computing systems. The most commonly used methods for error detection involve the addition of one or more bits, called redundancy bits, the bits representing the actual data. These redundancy bits are not data; but are meta data used solely to determine the correctness of the data bits.

One popular technique for error detection is the Cyclic Redundancy Check (CRC). With this technique, all of the characters in a message block are treated as a serial string of bits representing a binary number. This number is then divided modulo 2 by a predetermined binary number and the remainder of this division is appended to the block of characters as a CRC character. The CRC character is compared with the check character obtained in similar fashion at the end. If they agree, the message is assumed to be correct. If they disagree, an error message may be sent or the receiving terminal or host may demand a retransmission.

Referring to FIG. 1, in a conventional prior art implementation using CRC, a system 10 includes an enterprise disk storage 12 connected to host computers (hereafter, hosts) 14a, 14b, 14c. The term "enterprise" as used here means that the disk storage is configured to allow multiple connectivity by, for example, hosts provided by different vendors. Disk storage system 12 may be, for example, one of a number of different Symmetrix systems, products of EMC Corporation, Hopkinton, Mass. Details concerning the architecture and operation of these systems are found, for example, in Symmetrix Product Manuals for Models 5500, 52XX, 5100, 3500, 32XX, and 3100) all of which are incorporated herein by reference.

Referring to FIG. 2, a representative unit of data, here a 4 Kbyte (4096 bytes) sector 30 of data is transmitted by, for example, host 14a, to disk storage 12. Each sector includes eight blocks of data, each 512 bytes long. Associated with sector 30 is a CRC result 34 calculated and stored by host 12 with a CRC algorithm. This CRC result 34 is generally stored separately from sector 30, for example, on another disk storage. In a normal read operation, the CRC algorithm is reapplied by host 14a, and the result is compared with the previously calculated and stored CRC result 34. If the results are not the same, an indication that an error has occurred is generally provided in the form of an error message.

The above described application of the CRC algorithm by host 14a, is relatively straightforward in the case that host 14a, requests reading sector 30 entirely. However, if host 14a, makes a request to read only a portion of sector 30), for example, a 2 Kbyte portion, the process is not nearly as simple. In this case, the entire sector 30 is read by host 14a, and the CRC algorithm is applied to both the requested portion as well as the remainder portion. The two results are added together and then compared to the previously calculated and stored CRC result 34. Thus, the processing time needed to determine whether an error has occurred with any portion of the 4 Kbyte sector 30 is in fact, longer than that required to determine whether an error has occurred with the entire 4 Kbyte sector 30.

SUMMARY OF THE INVENTION

The invention features a method and system for maintaining the integrity of data in a storage system.

In a general aspect of the invention the method includes receiving a plurality of blocks of data having a predetermined multiple-block error detecting code; reading each block of the blocks of data; generating, for each block of data, an information-containing portion including an individual error detecting code for the block of data; and storing each block of data and each corresponding information-containing portion.

In essence, the method provides an error detecting code for individual blocks of data, rather than relying on the multiple-block error detecting code normally provided with the plurality of blocks of data (e.g., a sector of disk). As a result, throughput between host and storage is increased. At the same time, because an error detecting code is generated for each individual block, increased reliability in maintaining data integrity is provided.

In another aspect of the invention, the integrity of data stored by a plurality of hosts on a disk storage system is maintained. This method includes the following steps. A size of a largest one of the predetermined number of blocks transmitted by the plurality of hosts is determined. Blocks of data from each of the hosts is received, each of the blocks of data having a predetermined multiple-block error detecting code. Each block of data is read; and, for each block of data, an information-containing portion including an individual error detecting code for the block of data is generated. For each block of data less than the size of the largest one of the predetermined number of blocks, a filler portion including a number of bytes sufficient to equal the size of the largest one of the predetermined number of blocks is appended to the block of data. Each block of data, each corresponding information-containing portion, and, if necessary, each filler portion is then stored.

This arrangement has particular advantages for use with an enterprise storage system used to store data from different hosts that use different conventions for storing data. For example, one host may define a block as being 512 bytes, while another may define a block as being 520 bytes.

In either case, the method appends, where necessary, a filler portion so that all blocks are of the same size when stored.

Embodiments of these aspects of the invention may include one or more of the following features.

Each block of data is stored contiguously with its corresponding information-containing portion. Thus, unlike conventional schemes where the error detecting code is stored on a remote storage device, the block of data and its error detecting code can be stored together. Thus, accessing the data and its corresponding error code involves fewer read operations. Each information-containing portion further includes a time stamp and/or an indication of the author of the data. In this way, a user can determine whether the data is "stale" (i.e., older than desired) and, therefore, its reliability may be in question. The blocks of data represent a portion of a disk storage, for example, a sector of a disk. The sector of the disk storage is 4,096 bytes with each block being 512 bytes.

Another aspect of the invention features a storage system for storing data used by a number of hosts, each capable of transmitting blocks of data. The storage system includes storage array devices for storing blocks of data transmitted by the plurality of hosts; a channel adapter, associated with a corresponding one of the hosts, and including a first data block integrity unit for applying and storing error detection information associated with the transmitted blocks of data; and a storage array adapter, associated with a corresponding one of the storage array devices, and including a second data block integrity unit for retrieving data blocks from the corresponding storage array device and checking the error detection information associated with the stored blocks of data.

Embodiments of this aspect of the invention may include one or more of the following features. The storage system further includes a plurality of channel adapters, each associated with a corresponding one of the hosts. The storage system further includes a plurality of storage array adapters, each associated with a corresponding one of the storage array devices. The storage system includes a global memory connected between the channel adapter and storage array adapter.

Other advantages and features of the invention will be apparent from the following description and from the claims.

DETAILED DESCRIPTION

Figure 1:
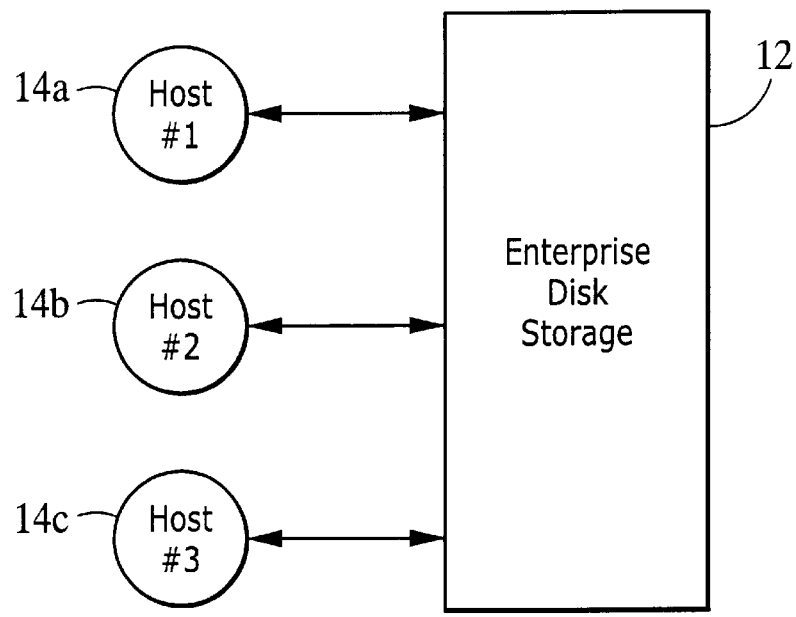
FIG. 1 is a block diagram representation of a conventional enterprise disk storage connected to a variety of hosts.
Figure 2:
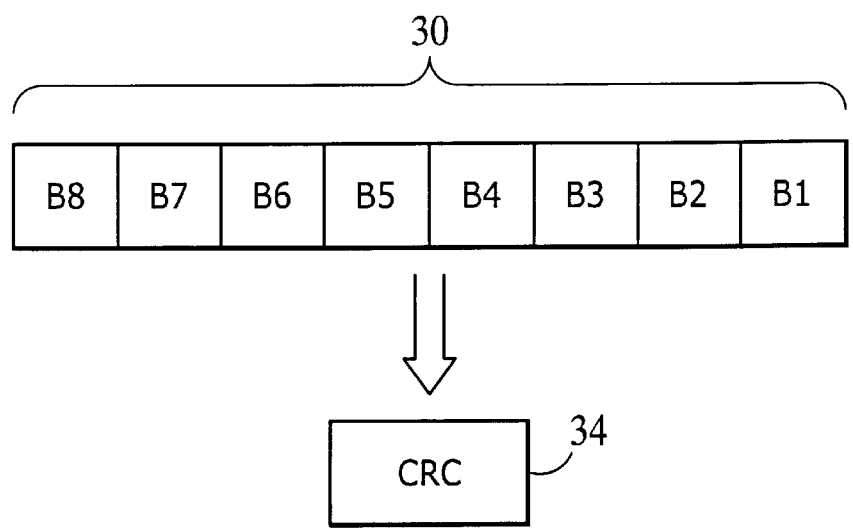
FIG. 2 is an example of a sector of data having blocks of data and an associated CRC result.
Figure 3:
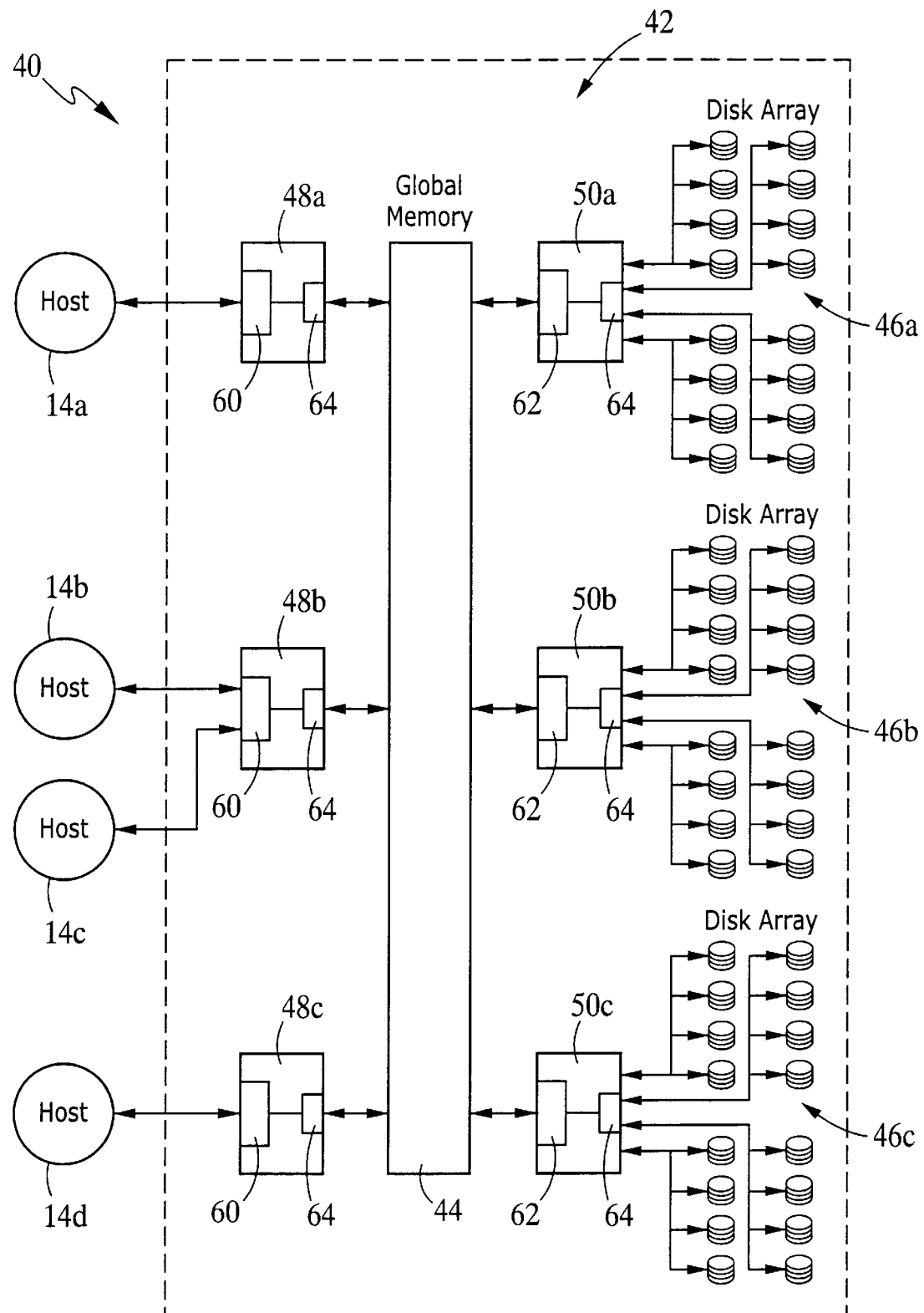
FIG. 3 is a block diagram representation of a enterprise disk storage connected to a variety of hosts through a data block integrity unit in accordance with the invention.

Referring to FIG. 3, a storage system 40 includes an enterprise disk storage 42 connected there, four host computers (hereafter, hosts) 14a, 14b, 14c, 14d, which may be of the same type or, more likely, provided by different manufacturers. Enterprise disk storage 42 includes a high speed "cache" or global memory 44 through which data is passed between the hosts and a number of disk array storages 46a, 46b, 46c. As will be described in greater detail below, storage system includes data integrity units which provides error detection for individual blocks of data, passing between the hosts and the disk array storages, rather than relying on multiple-block error detection schemes normally provided by the hosts themselves and associated with larger blocks of data (e.g., a sector of disk).

The front-end interface between the hosts and global memory 44 is provided through channel adapters (CA) 48a, 48b, 48c, while the back-end interface between the global memory and the disk array storages is provided via disk adapters (DA) 50a, 50b, 50c. These channel adapters and disk adapters include multi embedded processors and are often referred to as "directors" and "control units", respectively. Global memory buses (not shown) provide the connectivity between global memory 44 and both the channel adapters and the disk adapters.

Among other tasks, channel adapters receive data from a particular host and assemble data into a memory format compatible with that host. Each channel adapter is configured to serve multiple hosts. For example, as shown in FIG. 3, channel adapter 48b is configured to interface with hosts 14b, and 14c. Each of channel adapters 48a, 48b, 48c are configured to accommodate a particular type of host. For example, channel adapter 48a is configured to interface with mainframe host 14a, which, in this embodiment, complies with IBM's fiber optic channel architecture, known as ESCON (Enterprise System Connection). On the other hand, channel adapter 48b is configured to interface with hosts complying with well-known Small Computer Systems Interface (SCSI). Disk adapters on the back-end receive data from global memory 44 and disassemble data into the SCSI format compatible with disk array storages 46a, 46b, 46c.

Channel adapters 48a, 48b, 48c and disk adapters 50a, 50b, 50c both include data block integrity units 60, 62, respectively, for applying and storing an error detection algorithm on individual blocks of data passing between the hosts and the disk array storages. Although other error detection algorithms may be used by data block integrity units 60, 62, in this embodiment, a Cyclic Redundancy Check (CRC) is used to maintain the integrity of data. As will be described below in conjunction with FIGS. 4 and 5, the channel adapters receive data to be written into disk array storages and assemble the data into a memory word having an appropriate memory format. Sections of predetermined size of the memory words (e.g., 32 memory words) are stored in dual-port RAM 64 until it is filled, at which time, the contents of the RAM are "burst" or transferred into global memory 44 where it can be read by an appropriate disk adapter for storage in one or more disk array storages.

Figure 4:
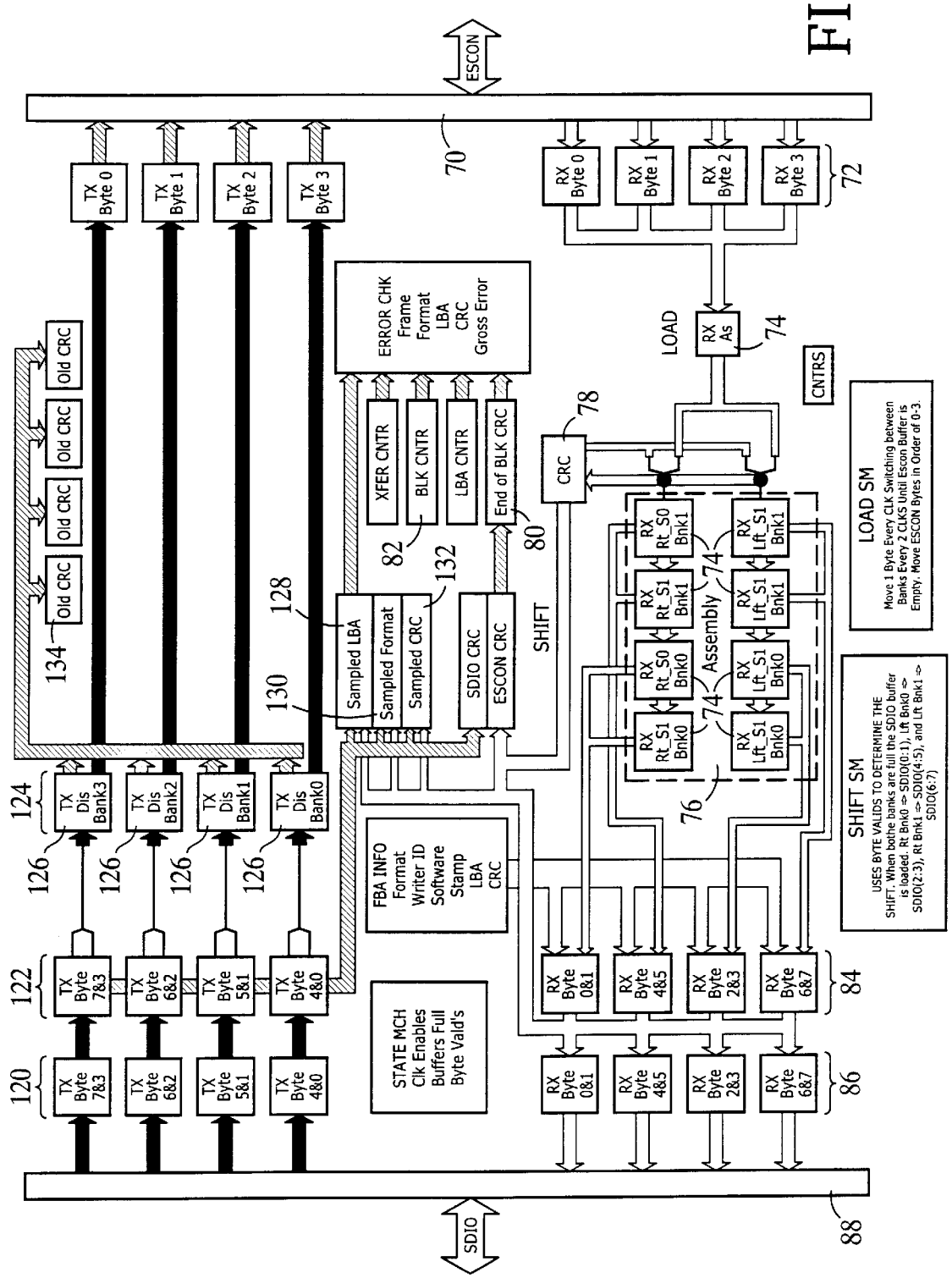
FIG. 4 is a block diagram representation of a data block integrity unit for a front-end control adapter.

Referring to FIG. 4, one embodiment of a data block integrity unit 60 of a channel adapter (here, adapter 48a) is shown. In this case, data block integrity unit 60 is configured to interface with ESCON mainframe host 14a. Data block integrity unit 60 includes an ESCON interface bus 70 which receives 32 bit words (4 bytes), each byte stored in one of four receive buffers 72. A load buffer 74 is used to sequentially read each byte from receive buffers 72 so that for every clock cycle the contents of the load buffer are read into assembly bank buffers 74 of an assembly stage 76.

As each byte is being read into an assembly bank buffer 74, a CRC generator 78 continuously calculates a CRC result (in this case, an ESCON CRC result), which is stored in an END OF BLK CRC register 80. A BLK counter 82 is used to count the number of bytes passing through load buffer 74.

Once bank buffers 74 are full, all eight bytes of data are shifted in parallel into a first pipeline stage 84. During each clock cycle, the eight bytes of data are shifted into a second pipeline stage 86, which then provides the data to a system data I/O bus 88 connected to dual-port RAM 64. Second pipeline stage 86 is provided to minimize the possibility of "stalling" ESCON interface bus 70 which is continuously receiving data and to avoid possible "collisions" when other control adapters (possibly on the same board) vie for use of the I/O bus 82.

Once a predetermined number of bytes (e.g., 512 bytes) is read by BLK counter 82, FBA information (8 bytes) is appended to the data passing between bank buffers 74 and first pipeline stage 84. Included as part of the appended FBA information, is the CRC result stored in register 80, as well as, a format code, a writer identification code, software stamp code, and a logical block address (LBA).

Figure 5:
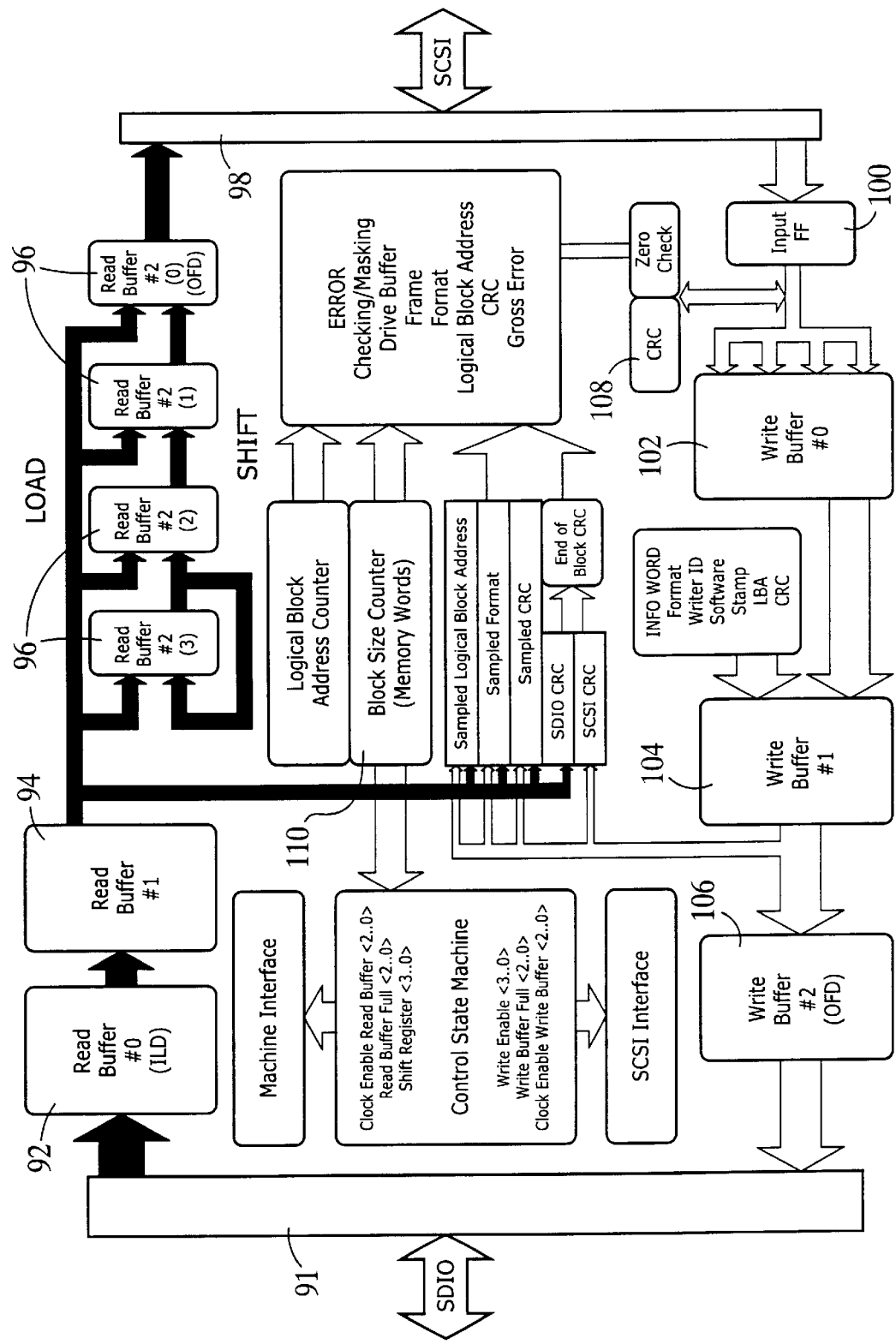
FIG. 5 is a block diagram representation of a data block integrity unit for a back-end disk adapter.

Referring to FIG. 5, one embodiment of a disk adapter 50a, suitable for retrieving the data (e.g., that assembled by control adapter 48a of FIG. 4) and storing the data within one of the disk array storages is shown. In this embodiment, the back-end data integrity unit 62 reads, via SDIO bus 91, data from global memory 44 through a series of buffers 90, 92 and disassemble bank buffers 94 and then generates a CRC result (for later comparison) when BLK counter 82 expires. The next memory word will include the FBA information containing the CRC result for that block. The generated CRC result will then be compared to the CRC in the FBA information. In particular, disk adapter 50a includes a block size counter 96 which tracks the number of bytes being read. Upon reading the predetermined number of bytes, in this case, 512 bytes, counter 96 knows that the FBA information is expected, including the format code, LBA starting address, and end-of-block CRC result. Each of these are checked to determine that they have the expected result. If so, the memory block is stored in the appropriate disk array storage via SCSI interface bus 98. If not, an error message is generated. When all of the memory blocks are read from the ESCON mainframe host 14a, to the disk array storage the write operation is complete.

In a read operation (i.e., a host requests data from a disk array storage), back-end disk adapter performs CRC checking on memory blocks read from the appropriate disk array storage. In particular, an input flip-flop 100 receives each memory word and conveys them to a series of write buffers 102, 104, and 106. During the time memory words are being passed from flip-flop 100 to write buffer 102, a CRC generator 108 calculates a CRC result for each memory word. It is important to appreciate that FBA information has been appended to and stored within the disk array storage with a block of memory words. As was the case with control adapter 48a, a block size counter 110 counts the number of bytes passing through flip-flop 100 and upon counting a predetermined number of bytes (e.g., 512 bytes) back-end disk adapter determines that the next set of bytes contains the FBA information including the format code, LBA starting address, and end-of-block CRC result. If this FBA information agrees with what is expected, memory words are allowed to continue to be passed on to write buffer 102. As memory words are passed from write buffer 102 to write buffer 104, disk adapter 50a inserts a new writer identification code, which identifies who wrote the data. The memory words are then passed on to global memory 44 through writer buffer 106 and SDIO bus 91.

Referring again to FIG. 4, channel adapter 48a reads data from global memory into dual-port RAM 64 and into a first read buffer stage 120 via SDIO bus 88. The data is passed onto a second read buffer stage 122 and is multiplexed into a disassembler stage 124 having four bank buffers 126, each holding eight bytes of data. Block counter 82 is used to determine when the FBA information is reached for a block of memory words. At this point, LBA address, the format code and CRC result are stored in sample registers 128, 130, 132, respectively. This information is checked, and if an error is detected, it is flagged. In certain embodiments, OLD CRC buffers may be included to support conventional CRC checking provided by the host. Because each channel adapter knows when the FBA information will be present, the channel adapter checks the CRC result associated with each block. Further, because the host does not need it, the FBA information is discarded after it has been checked. Transfer of data continues in this manner until all of the data is transmitted.

It is important to appreciate that in the exemplary embodiment of control adapter 48a shown in FIG. 4 was used to assemble and disassemble data for an ESCON host. Other control adapters (e.g., 48b and/or 48c) connected to storage system 40 may be configured to assemble and disassemble data from other types of hosts, such as those having a SCSI interface.

Figure 6:
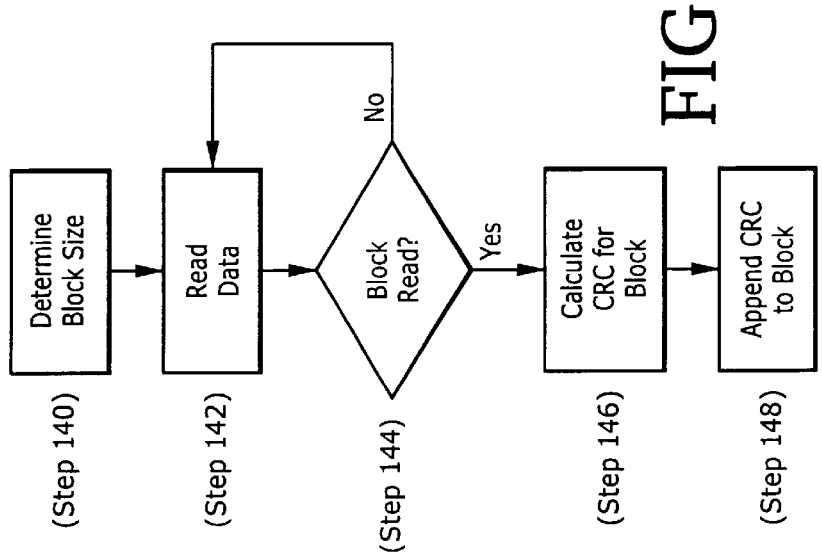
FIG. 6 is a flow diagram illustrating the operation of the integrity unit of FIG. 3 during a write operation.
Figure 7:
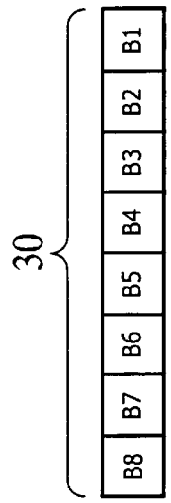
FIG. 7 is a schematic representation of a sector of data having blocks of data received by the integrity unit of FIG. 4 and the resultant data and CRC result stored in the enterprise disk storage.

Referring to FIGS. 6 and 7, a flow diagram (FIG. 6) summarizes the write operation of data block integrity unit 60 on a data sector 30 (FIG. 7) received by a host. In particular, when a host requests a write operation to one of the disk array storages, the data is read first by integrity unit 60. Data transmitted from any host generally includes a header which includes metadata (i.e., information relating to the data). The metadata typically includes, for example, the size of the blocks of data being transmitted, a time/date stamp, and, as described above, the author (writer identification) of the work. Integrity data unit 60 first reads the header to determine the size of blocks being transmitted by the particular host (step 140). Block counter 82 (FIG. 4) of integrity unit 60 is initialized and data is read (step 142). When counter 82 indicates that an entire block has been read (step 144), a CRC result is generated for that particular block (step 146). The CRC result is then appended to the block of data and forwarded to the appropriate disk storage array (step 148) and the procedure repeated for subsequent blocks. As can be seen from FIG. 7, therefore, each block (B1, B2, . . . ) has an associated CRC result stored with the block of data .

Figure 8:
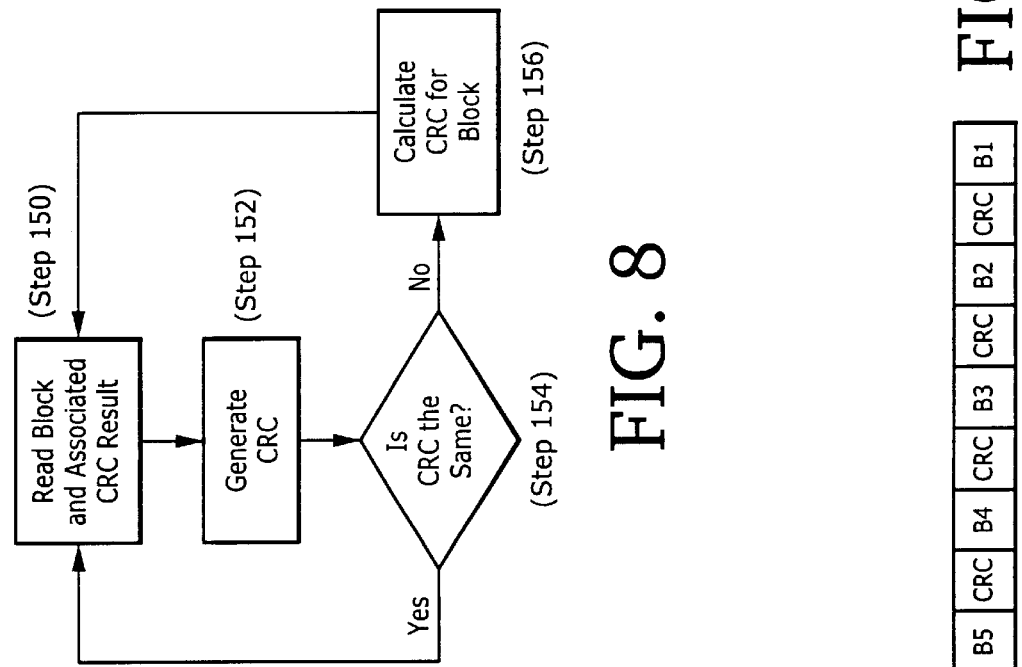
FIG. 8 is a flow diagram illustrating the operation of the integrity unit of FIG. 5 during a read operation.

Referring to FIG. 8, when the host requests reading all or any portion of a sector from a disk array storage, integrity unit 60 reads each individual block of data as it is retrieved from disk array storage (step 150). Integrity unit 60 then generates a CRC result from the block of data (step 152). The newly generated CRC result is compared with the previously stored CRC result (step 154). If the results are different, an error message is generated (step 156). Otherwise, the procedure is repeated for subsequent blocks.

Other embodiments are within the scope of the claims. For example, because disk storage 40 is an enterprise storage unit, it must be able to receive data from any of a variety of different hosts. Hosts from different vendors, however, may use a different block size. Although in most fixed block architectures, 512 bytes is well-accepted block size, other architectures may use a block size of, for example, 520 or 528 bytes. In this case, integrity data units 60 and 62 of the control adapters and disk adapters, respectively will determine a maximum block size for all hosts connected to disk storage 40. Once this maximum is determined, integrity units 60, 62 will, during write operations, append additional bytes (with no data) to blocks from vendors that do not support the larger block size so that all blocks are of the same size.

It will be appreciated by one skilled in the art that many additional and different components and many additional and different configurations other than those described herein could be used without departing from the scope of the following claims.

What is claimed is:

1. A method of maintaining integrity of transmitted data, the method comprising:

receiving a plurality of blocks of data, said plurality of blocks of data having a predetermined multiple-block error detecting code;

reading each block of said plurality of blocks of data;

generating, for each block of data, an information-containing portion including an individual error detecting code for the block of data; and storing each block of data and each corresponding information-containing portion.

2. The method of claim 1 wherein each block of data is stored contiguously with each corresponding information-containing portion.

3. The method of claim 1 wherein each information-containing portion further includes a time stamp.

4. The method of claim 1 wherein each information-containing portion further includes an author.

5. The method of claim 1 wherein the plurality of blocks of data represents a portion of a disk storage.

6. The method of claim 5 wherein the portion of the disk storage represents a sector of the disk storage.

7. The method of claim 6 wherein the sector of the disk storage is 4,096 bytes and each block of the plurality of blocks of data is 512 bytes.

8. A method of maintaining integrity of data stored by a plurality of hosts on a disk storage system, each host transmitting a predetermined number of blocks of data, the method comprising:

determining a size of a largest one of the predetermined number of blocks transmitted by the plurality of hosts;

receiving the plurality of blocks of data from each of said plurality of hosts, each of said plurality of blocks of data having a predetermined multiple-block error detecting code;

reading each block of said plurality of blocks of data;

generating, for each block of data, an information-containing portion including an individual error detecting code for the block of data;

appending, for each of said plurality of blocks of data less than the size of the largest one of the predetermined number of blocks, a filler portion including a number of bytes sufficient to equal the size of the largest one of the predetermined number of blocks; and storing each block of data, each corresponding information-containing portion, and, if necessary, each filler portion.

9. The method of claim 8 wherein each block of data is stored contiguously with each corresponding information-containing portion.

10. The method of claim 8 wherein each information-containing portion further includes a time stamp.

11. The method of claim 8 wherein each information-containing portion further includes an author.

12. The method of claim 8 wherein the plurality of blocks of data represents a portion of a disk storage.

13. The method of claim 12 wherein the portion of the disk storage represents a sector of the disk storage.

14. A storage system for storing data used by a plurality of hosts, each host capable of transmitting blocks of data, the storage system comprising:

a plurality of storage array devices for storing blocks of data transmitted by the plurality of hosts;

a channel adapter associated with a corresponding one of the hosts, the channel adapter including a first data block integrity unit for applying and storing error detection information associated with the transmitted blocks of data; and a storage array adapter associated with a corresponding one of the storage array devices, the storage array adapter including a second data block integrity unit for retrieving data blocks from the corresponding storage array device and checking the error detection information associated with the stored blocks of data.

15. The storage system of claim 14 further comprising a plurality of channel adapters, each associated with a corresponding one of the hosts.

16. The storage system of claim 14 further comprising a plurality of storage array adapters, each associated with a corresponding one of the storage array devices.

17. The storage system of claim 14 further comprising a global memory connected between the channel adapter and storage array adapter.

* * * * *